United States Patent
Kikitsu et al.

(10) Patent No.: US 10,468,354 B2
(45) Date of Patent: Nov. 5, 2019

(54) SEMICONDUCTOR DEVICE WITH MAGNETIC LAYER AND NONMAGNETIC LAYER

(71) Applicant: KABUSHIKI KAISHA TOSHIBA, Tokyo (JP)

(72) Inventors: Akira Kikitsu, Yokohama Kanagawa (JP); Hitoshi Iwasaki, Nerima Tokyo (JP); Yoshinari Kurosaki, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/908,212

(22) Filed: Feb. 28, 2018

(65) Prior Publication Data

US 2018/0337139 A1 Nov. 22, 2018

(30) Foreign Application Priority Data

May 16, 2017 (JP) .................... 2017-097018

(51) Int. Cl.
*H01L 23/552* (2006.01)
*H01L 43/02* (2006.01)
(Continued)

(52) U.S. Cl.
CPC .......... *H01L 23/552* (2013.01); *G11B 5/3932* (2013.01); *H01L 43/02* (2013.01);
(Continued)

(58) Field of Classification Search
CPC ... H01L 23/552–556; H01L 2924/3025; H01L 43/02–08; G02F 2001/133334; G11B 5/39–3993
See application file for complete search history.

(56) References Cited

U.S. PATENT DOCUMENTS 7,981,528 B2 7/2011 Nakatani et al.
2005/0162249 A1 7/2005 Simola
(Continued)

FOREIGN PATENT DOCUMENTS

JP S61-237500 10/1986
JP S62-256498 11/1987
(Continued)

OTHER PUBLICATIONS

K. Yamada et al., "High-Performance Laminated Thin-Film Shield With Conductors and Magnetic Material Multilayer," 2011 IEEE International Symposium on Electromagnetic Compatibility, pp. 432-437.

*Primary Examiner* — Nelson Garces
(74) *Attorney, Agent, or Firm* — Finnegan, Henderson, Farabow, Garrett & Dunner, L.L.P.

(57) ABSTRACT

According to one embodiment, a semiconductor device includes a semiconductor element, and a first member. The first member includes a first nonmagnetic planar region separated from the semiconductor element in a first direction, a first magnetic planar region provided between the first nonmagnetic planar region and the semiconductor element in the first direction, and a second nonmagnetic planar region provided between the first magnetic planar region and the semiconductor element in the first direction. The first magnetic planar region includes a first end portion extending along a second direction crossing the first direction. A first magnetization direction of the first magnetic planar region is tilted with respect to the second direction.

19 Claims, 8 Drawing Sheets

(51) Int. Cl.
   *H01L 43/08*   (2006.01)
   *G11B 5/39*   (2006.01)
   *H01L 23/31*   (2006.01)
   *H01L 23/00*   (2006.01)
   *H01L 23/498*   (2006.01)

(52) U.S. Cl.
   CPC .......... *H01L 43/08* (2013.01); *H01L 23/3128* (2013.01); *H01L 23/49827* (2013.01); *H01L 24/48* (2013.01); *H01L 2224/48091* (2013.01); *H01L 2224/48106* (2013.01); *H01L 2224/48227* (2013.01); *H01L 2924/3025* (2013.01)

(56) References Cited

U.S. PATENT DOCUMENTS

| | | | |
|---|---|---|---|
| 2014/0268405 A1* | 9/2014 | Machita | G01R 33/093 360/75 |
| 2014/0374860 A1* | 12/2014 | Suzuki | H01L 23/552 257/422 |
| 2017/0092303 A1* | 3/2017 | Jiang | G11B 5/315 |
| 2018/0269181 A1* | 9/2018 | Yang | H01L 25/0655 |

FOREIGN PATENT DOCUMENTS

| | | |
|---|---|---|
| JP | H2-172299 | 7/1990 |
| JP | 2003-23286 | 1/2003 |
| JP | 2005-514797 | 5/2005 |
| JP | 2008-103691 | 5/2008 |
| JP | 2010-206182 | 9/2010 |
| JP | 2012-033764 | 2/2012 |
| JP | 2012-038807 | 2/2012 |

* cited by examiner

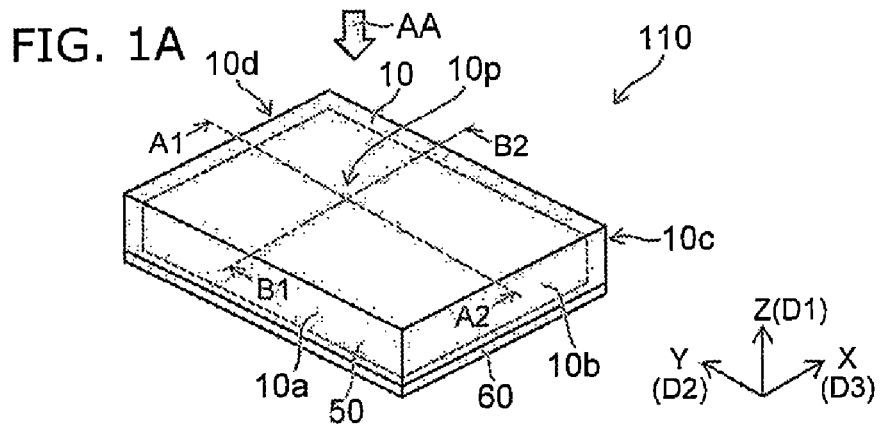
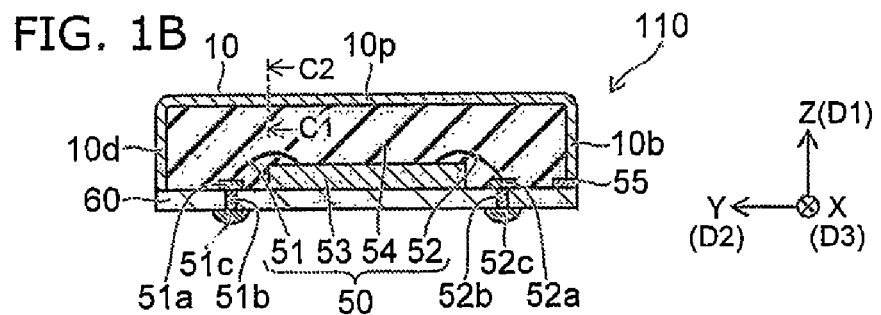
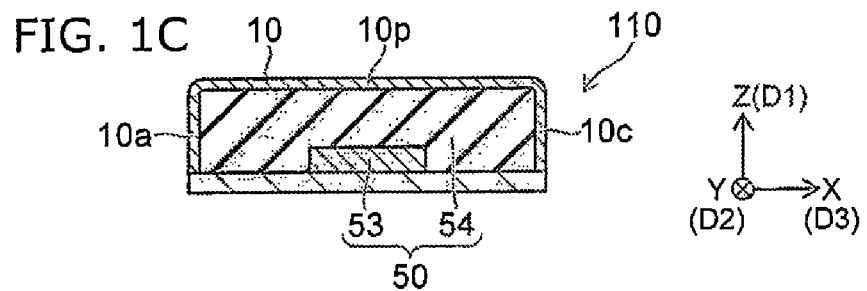
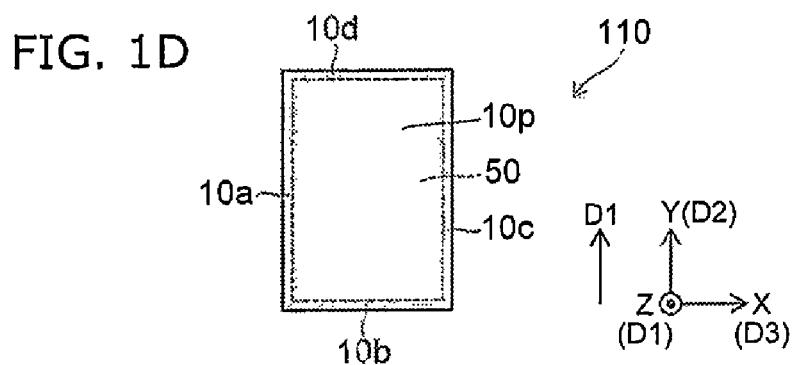

US 10,468,354 B2

SEMICONDUCTOR DEVICE WITH MAGNETIC LAYER AND NONMAGNETIC LAYER

CROSS-REFERENCE TO RELATED APPLICATIONS

This application is based upon and claims the benefit of priority from Japanese Patent Application No. 2017-097018, filed on May 16, 2017; the entire contents of which are incorporated herein by reference.

FIELD

Embodiments described herein relate generally to a semiconductor device.

BACKGROUND

For example, there is a semiconductor device that includes a semiconductor element and a shield layer. Electromagnetic waves that are radiated from the semiconductor element are shielded by the shield layer. It is desirable for the shield layer to improve the attenuation characteristics of the electromagnetic waves.

BRIEF DESCRIPTION OF THE DRAWINGS

FIG. 1A to FIG. 1D are schematic views illustrating a semiconductor device according to a first embodiment;

FIG. 3A and FIG. 38 are graphs illustrating characteristics of semiconductor devices;

DETAILED DESCRIPTION

Figures 2A, 2B:
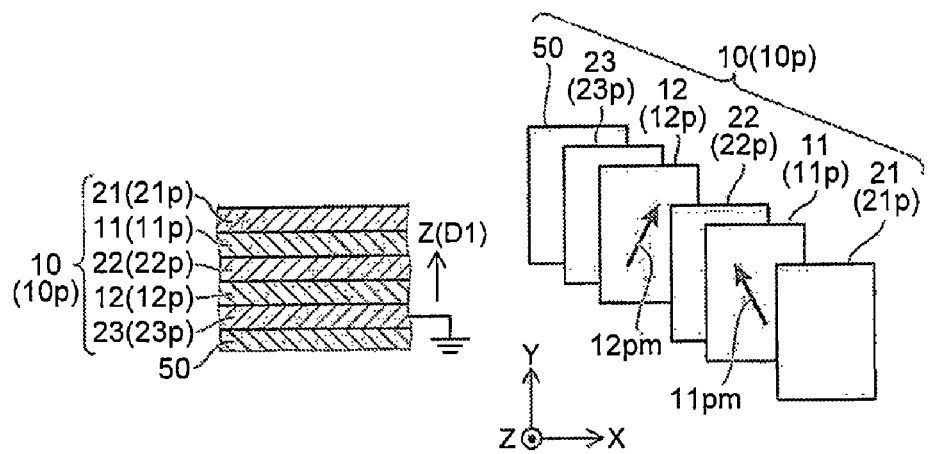
FIG. 2A to FIG. 2D are schematic views illustrating the semiconductor device according to the first embodiment.

According to one embodiment, a semiconductor device includes a semiconductor element, and a first member. The first member includes a first nonmagnetic planar region separated from the semiconductor element in a first direction, a first magnetic planar region provided between the first nonmagnetic planar region and the semiconductor element in the first direction, and a second nonmagnetic planar region provided between the first magnetic planar region and the semiconductor element in the first direction. The first magnetic planar region includes a first end portion extending along a second direction crossing the first direction. A first magnetization direction of the first magnetic planar region is tilted with respect to the second direction.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. There are also cases where the dimensions and/or the proportions are illustrated differently between the drawings, even in the case where the same portion is illustrated.

In this specification and each drawing, components similar to ones described in reference to an antecedent drawing are marked with the same reference numerals; and a detailed description is omitted as appropriate.

First Embodiment

FIG. 1A to FIG. 1D are schematic views illustrating a semiconductor device according to a first embodiment. FIG. 1A is a perspective view. FIG. 1B is a cross-sectional view of FIG. 1A along a line A1-A2. FIG. 1C is a cross-sectional view of FIG. 1A along a line B1-B2. FIG. 1C is a plan view as viewed along arrow AA of FIG. 1A.

As shown in FIG. 1A, the semiconductor device 110 according to the first embodiment includes a semiconductor element 50 and a first member 10. A base body 60 is further provided in the example. The first member 10 covers at least a portion of the semiconductor element 50.

In the example as shown in FIG. 1B, the semiconductor element 50 includes a semiconductor chip 53, an insulating portion 54, a first wire 51, and a second wire 52. In the example, a first electrode 51a, a second electrode 52a, a first connector 51b, a second connector 52b, a first terminal 51c, and a second terminal 52c are provided in the base body 60. The first wire 51 electrically connects the first electrode 51a and a portion of the semiconductor chip 53. The second wire 52 electrically connects the second electrode 52a and another portion of the semiconductor chip 53. The first electrode 51a and the first terminal 51c are electrically connected by the first connector 51b. The second electrode 52a and the second terminal 52c are electrically connected by the second connector 52b. These connectors pierce the base body 60. These terminals function as input/output portions of the semiconductor chip 53. The insulating portion 54 is provided around the semiconductor chip 53. The insulating portion 54 includes, for example, at least one of a resin, a ceramic, or the like. The semiconductor chip 53 is protected by the insulating portion 54. The semiconductor element 50 includes, for example, at least one of an arithmetic circuit, a control circuit, a storage circuit, a switching circuit, a signal processing circuit, or a high frequency operation circuit.

As illustrated in FIG. 1B, the first member 10 is electrically connected to a terminal 55 provided in the base body 60. The first member 10 is set to an electric potential (e.g., a ground potential) via the terminal 55. For example, the first member 10 shields (attenuates) the electromagnetic waves radiated from the semiconductor element 50. The first member 10 functions as, for example, a shield.

As shown in FIG. 1A to FIG. 1C, the first member 10 includes a planar portion 10p and first to fourth side surface portions 10a to 10d. The planar portion 10p of the first member 10 is separated from the semiconductor element 50 along a first direction D1.

The first direction D1 is set as a Z-axis direction. One direction perpendicular to the Z-axis direction is set as a Y-axis direction. A direction perpendicular to the Z-axis direction and the Y-axis direction is set as an X-axis direction.

As shown in FIG. 1B and FIG. 1C, the semiconductor element 50 is placed between the planar portion 10p and the base body 60 along the first direction D1.

As shown in FIG. 1C and FIG. 1D, the semiconductor element 50 is placed between the first side surface portion 10a and the third side surface portion 10c along the X-axis direction.

As shown in FIG. 1B and FIG. 1D, the semiconductor element 50 is placed between the second side surface portion 10b and the fourth side surface portion 10d along the Y-axis direction.

As described below, the first member 10 includes multiple layers. An example of the multiple layers will now be described.

Figures 2C, 2D:
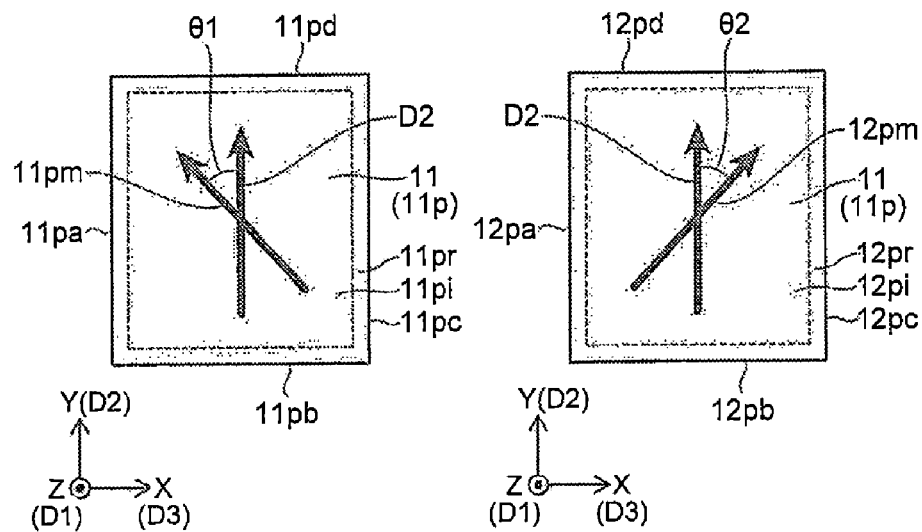

FIG. 2A to FIG. 2D are schematic views illustrating the semiconductor device according to the first embodiment. FIG. 2A is a cross-sectional view of FIG. 1B along a line C1-C2. FIG. 2B schematically shows the configuration of the layers included in the first member 10. In FIG. 2B, the position of each layer is shifted for the purpose of easier viewing of the drawing. FIG. 2C and FIG. 2D are plan views respectively showing a layer included in the first member 10.

As shown in FIG. 2A and FIG. 2B, the first member 10 includes a first nonmagnetic layer 21, a second nonmagnetic layer 22, and a first magnetic layer 11. The first member 10 may further include a second magnetic layer 12 and a third nonmagnetic layer 23.

The first to third nonmagnetic layers 21 to 23 respectively include first to third nonmagnetic planar regions 21p to 23p. The first magnetic layer 11 includes a first magnetic planar region 11p. The second magnetic layer 12 includes a second magnetic planar region 12p.

The first nonmagnetic planar region 21p is separated from the semiconductor element 50 in the first direction D1 (the Z-axis direction). The first magnetic planar region 11p is provided between the first nonmagnetic planar region 21p and the semiconductor element 50 in the first direction D1. The second nonmagnetic planar region 22p is provided between the first magnetic planar region 11p and the semiconductor element 50 in the first direction D1.

The second magnetic planar region 12p is provided between the second nonmagnetic planar region 22p and the semiconductor element 50 in the first direction D1. The third nonmagnetic planar region 23p is provided between the second magnetic planar region 12p and the semiconductor element 50 in the first direction D1.

For example, the first magnetic planar region 11p contacts the first nonmagnetic planar region 21p and the second nonmagnetic planar region 22p. The second magnetic planar region 12p contacts the second nonmagnetic planar region 22p and the third nonmagnetic planar region 23p.

Thus, a magnetic layer (region) is provided between multiple nonmagnetic layers (regions) in the embodiment. When an electromagnetic wave is irradiated to the first member 10, the electromagnetic wave undergoes multiple reflections at the interfaces between the magnetic layer and the nonmagnetic layer. A portion of the electromagnetic wave may be absorbed at the interfaces. Thereby, the electromagnetic wave that passes through the first member 10 is attenuated. The first member 10 functions as a shield.

As shown in FIG. 2B, the first magnetic planar region 11p has a first magnetization direction 11pm. The second magnetic planar region 12p has a second magnetization direction 12pm. The second magnetization direction 12pm crosses the first magnetization direction 11pm.

Examples of a configuration of the magnetic planar regions and the magnetization directions will now be described.

FIG. 2C illustrates the configuration of the first magnetic planar region 11p. FIG. 2D illustrates the configuration of the second magnetic planar region 12p. The planar configuration is on the X-Y plane.

As shown in FIG. 2C, the first magnetic planar region 11p includes a first end portion 11pa. The first end portion 11pa extends along a second direction D2. The second direction D2 crosses the first direction D1 (the Z-axis direction). The first end portion 11pa is a side portion. In the example, the second direction D2 is the Y-axis direction. The first magnetic planar region 11p further includes other end portions (end portions 11pb, 11pc, 11pd, etc.).

One direction crossing a plane (in the example, the Z-Y plane) including the first direction D1 and the second direction D2 is taken as a third direction D3. The third direction D3 is, for example, the X-axis direction.

The end portion 11pb and the end portion 11pd extend along the third direction D3. The end portion 11pc extends along the second direction D2. The direction from the end portion 11pb toward the end portion 11pd is the second direction D2. The direction from the first end portion 11pa toward the end portion 11pc is the third direction D3. The first magnetic planar region 11p is, for example, substantially a quadrilateral (including a parallelogram, a rectangle, or a square).

As shown in FIG. 2D, the second magnetic planar region 12p includes a second end portion 12pa. The second end portion 12pa extends along the second direction D2. The second magnetic planar region 12p further includes other end portions (end portions 12pb, 12pc, 12pd, etc.). The end portion 12pb and the end portion 12pd extend along the third direction D3. The end portion 12pc extends along the second direction D2. The direction from the end portion 12pb toward the end portion 12pd is the second direction D2. The direction from the second end portion 12pa toward the end portion 12pc is the third direction D3. The second magnetic planar region 12p is, for example, substantially a quadrilateral (including a parallelogram, a rectangle, or a square).

In the embodiment, the first magnetization direction 11pm of the first magnetic planar region 11p is tilted with respect to the second direction D2. The absolute value of a first angle θ1 between the first magnetization direction 11pm and the second direction D2 is greater than 0 degrees but less than 90 degrees. Thereby, as described below, the attenuation characteristics of the electromagnetic waves can be improved.

In the embodiment, for example, the second magnetization direction 12pm of the second magnetic planar region 12p is tilted with respect to the second direction D2. The absolute value of a second angle θ2 between the second magnetization direction 12pm and the second direction D2 is greater than 0 degrees but less than 90 degrees. For example, the second magnetization direction 12pm crosses the first magnetization direction 11pm. Thereby, the attenuation characteristics of the electromagnetic waves can be improved further.

The first magnetization direction 11pm and the second magnetization direction 12pm are the directions of the magnetizations under the condition of substantially no external magnetic field. This condition, for example, may include a weak magnetic field such as geomagnetic field.

In the embodiment, for example, the first magnetization direction 11pm recited above is a direction of the magnetization of a portion of the first magnetic planar region 11p at some distance from the outer edge region. The first magnetic planar region 11p includes an outer edge region 11pr and an inner region 11pi. The inner region 11pi is on the inner side from the outer edge region 11pr. For example, the first magnetization direction 11pm is the direction of the magnetization in the inner region 11pi. For example, shape and magnetic characteristics of the outer edge region 11pr may be non-uniform due to non-uniformity in the forming process of the first magnetic planar region 11p. For example, the first magnetization direction 11pm corresponds to the direction of the magnetization at the portion where the magnetization direction is in the inner region 11pi. For example, the first magnetization direction 11pm is the direction of the magnetization in the central region of the first magnetic planar region 11p (e.g., the center between the first end portion 11pa and the end portion 11pc and the center between the end portion 11pb and the end portion 11pd).

Similarly, the second magnetic planar region 12p includes an outer edge region 12pr and an inner region 12pi. The inner region 12pi is on the inner side from the outer edge region 12pr. For example, the second magnetization direction 12pm is the direction of the magnetization in the inner region 12pi. The second magnetization direction 12pm is, for example, the direction of the magnetization in the central region of the second magnetic planar region 12p (e.g., the center between the second end portion 12pa and the end portion 12pc and the center between the end portion 12pb and the end portion 12pd).

Examples of relationships between the magnetization directions and the magnetic characteristics will now be described.

Figure 3A:
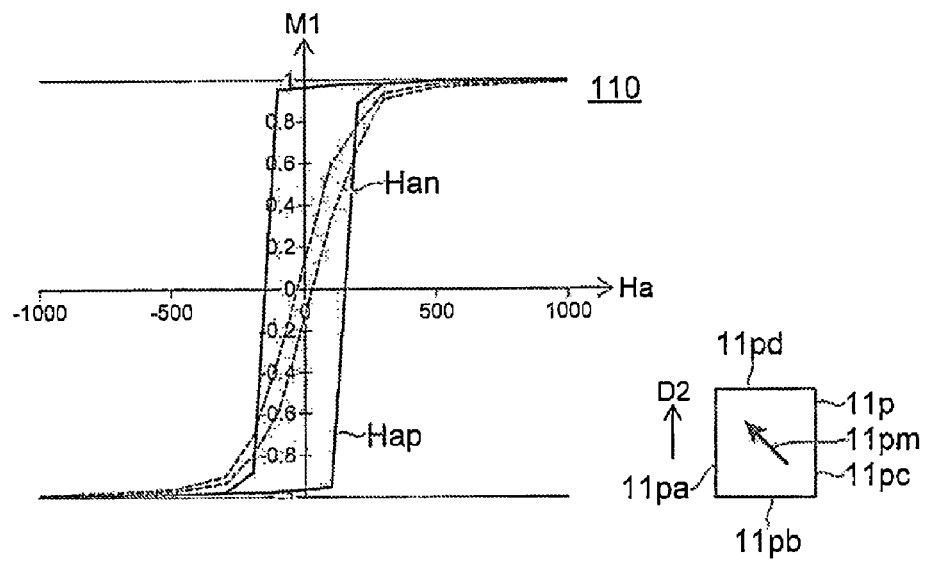
Figure 3B:
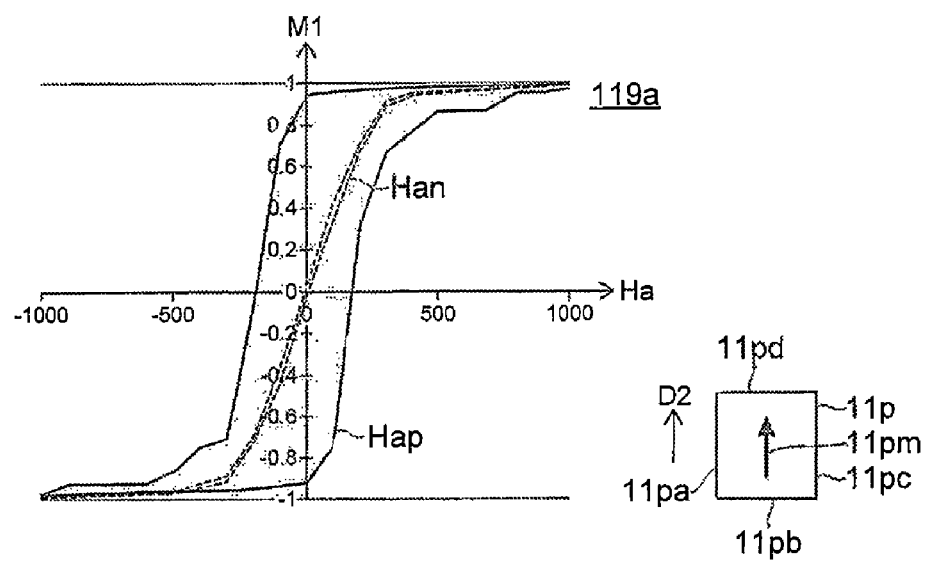

FIG. 3A and FIG. 3B are graphs illustrating characteristics of semiconductor devices.

These figures illustrate magnetic characteristics of the first magnetic planar region 11p of the first member 10. FIG. 3A corresponds to characteristics of the semiconductor device 110 according to the embodiment. FIG. 3B corresponds to characteristics of a semiconductor device 119a of a reference example.

In the semiconductor device 110, as described above, the first magnetization direction 11pm of the first magnetic planar region 11p is tilted with respect to the second direction D2 in which the first end portion 11pa extends. In the example, the first angle θ1 between the first magnetization direction 11pm and the second direction D2 is 45 degrees. On the other hand, in the semiconductor device 119a, the first magnetization direction 11pm is parallel to the second direction D2 (the first angle θ1 is 0 degrees).

FIG. 3A and FIG. 3B show simulation results of the change of a magnetization M1 of the first magnetic planar region 11p with an external magnetic field Ha applied to each types of the first magnetic planar regions 11p. The simulation uses the LLG (Landau Lifshitz Gilbert) equation. In the simulation, the length in the X-axis direction and the length in the Y-axis direction of the first magnetic planar region 11p each are 5 μm. The thickness (the length in the Z-axis direction) of the first magnetic planar region 11p is 50 nm. The material of the first magnetic planar region 11p is NiFe. In the simulation, the first magnetic planar region 11p is modeled by a cubic mesh in which the length of one side is 50 nm.

In these figures, the horizontal axis is the external magnetic field Ha (Oe (oersteds)). The vertical axis is the magnetization M1. Hap is a magnetization when the external magnetic field Ha is parallel to the first magnetization direction 11pm. Han is a magnetization when the external magnetic field Ha is perpendicular to the first magnetization direction 11pm.

For the reference example shown in FIG. 3B, Hap curve shows unstable magnetization change in the range where the absolute value of the external magnetic field Ha is 300 Oe to 1000 Oe. Such an, unstable characteristic is expected to have a negative effect on the attenuation characteristics of the electromagnetic waves.

Conversely, as shown in FIG. 3A, the unstable characteristic recited above is not observed for the configuration of the semiconductor device 110 according to the embodiment. Therefore, in the embodiment, improved attenuation characteristics are obtained.

As described below, such a difference in the magnetization state is caused by the difference in the magnetic charge at the end portion of the first magnetic planar region 11p.

Figure 4A:
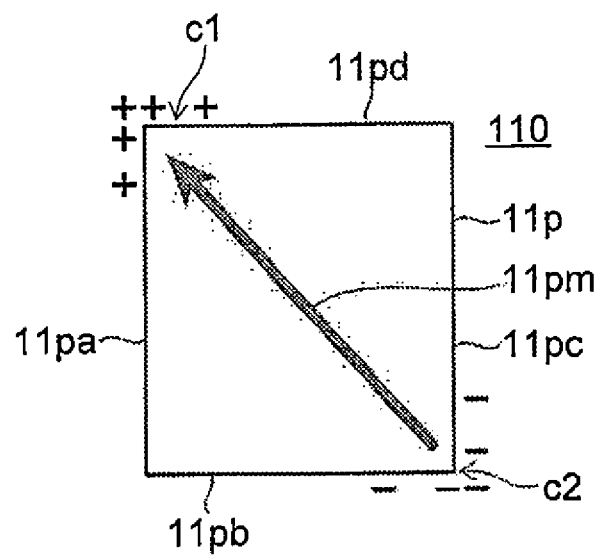
FIG. 4A and FIG. 4B are schematic views illustrating characteristics of the semiconductor devices.
Figure 4B:
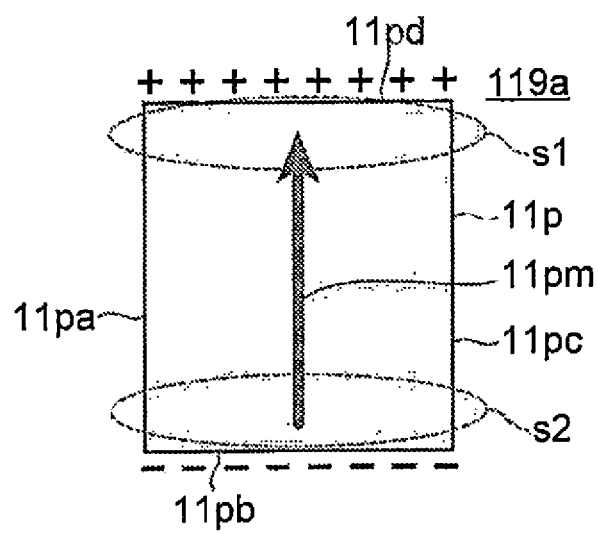

FIG. 4A and FIG. 4B are schematic views illustrating magnetic characteristics of the semiconductor devices.

These figures show the states of the magnetic charge of the first magnetic planar region 1ip. In these figures, the magnetic charge are illustrated by the symbols of "+" and "−." FIG. 4A corresponds to the configuration of the semiconductor device 110 (the first magnetization direction 11pm being tilted with respect to the second direction D2). FIG. 4B corresponds to the configuration of the semiconductor device 119a (the first magnetization direction 11pm being parallel to the second direction D2).

In the configuration of the semiconductor device 119a, the magnetization is oriented in the direction of the easy axis when the external magnetic field Ha is zero. Therefore, as shown in FIG. 4B, the magnetic charge of "+" and the magnetic charge of "-" are generated at the whole edge of the two sides (the end portion 11pb and the end portion 11pd) of the first magnetic planar region 11p. In such a case, strong demagnetizing field is applied to the entire end portion 11pb and the entire end portion 11pd. Therefore, the magnetization states are disturbed in a vicinity region s1 of the end portion 11pb and a vicinity region s2 of the end portion 11pd. Since a permeability μ fluctuates in the portion where the magnetization is disturbed, the attenuation performance changes in these portions. As a result, total attenuation performance of the electromagnetic waves for the element degrades. For example, when multiple of semiconductor devices are used, the attenuation performance deviates from elements to elements. For example, the attenuation performance becomes spatially non-uniform.

Conversely, in the configuration of the semiconductor device 110 as shown in FIG. 4A, the magnetic charge concentrates locally at corners c1 and c2 of the first magnetic planar region 1ip. The regions (the corners c1 and c2) where the magnetic charge concentrates are narrow. Therefore, the demagnetizing field applied to the first magnetic planar region 11p is small and is local. Therefore, the disturbance of the magnetization is suppressed. Thereby, a high attenuation performance is obtained. For example, when multiple of semiconductor devices are used, the attenuation performance is uniform.

Figures 5A, 5B:
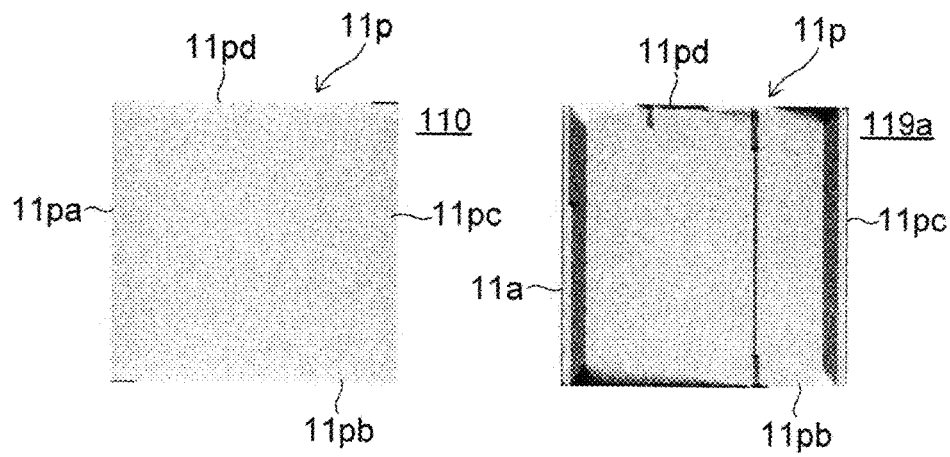
FIG. 5A to FIG. 5D are schematic views illustrating characteristics of the semiconductor devices.
Figures 5C, 5D:
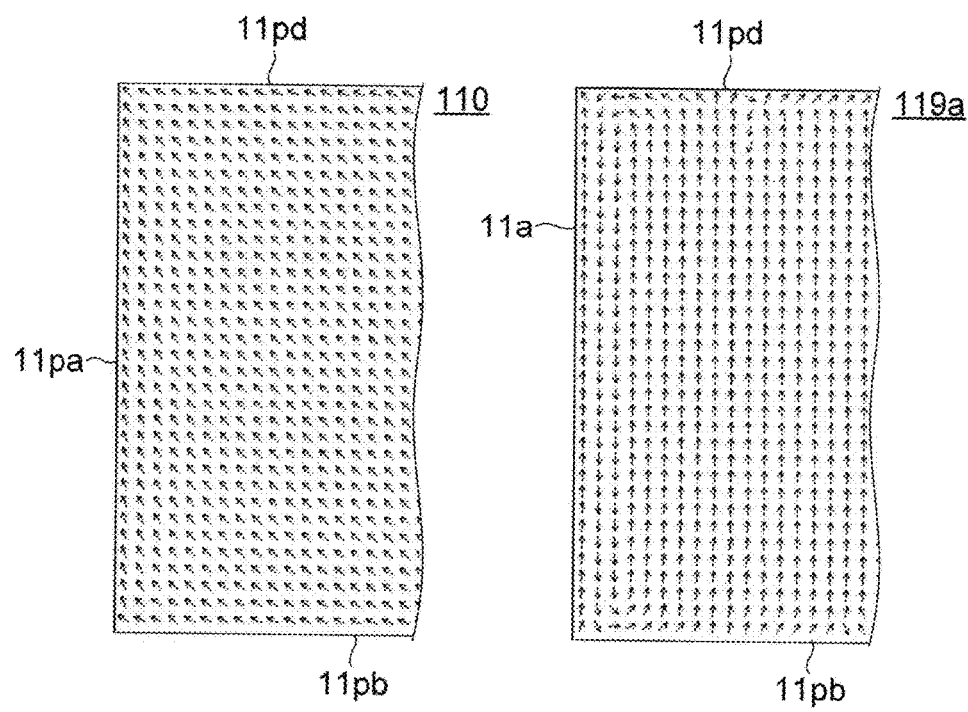
Figure 6A:
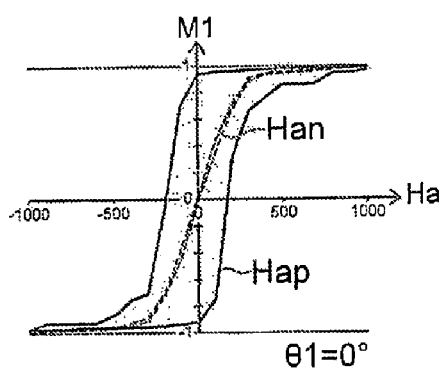
FIG. 6A to FIG. 6F are graphs illustrating characteristics of the semiconductor devices.
Figure 6B:
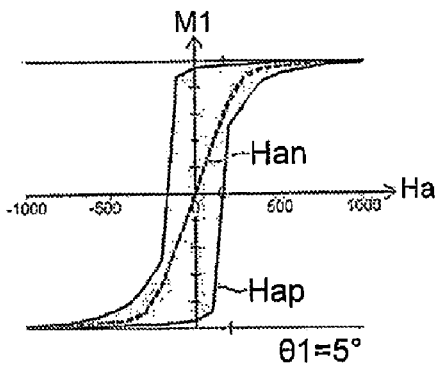
Figure 6C:
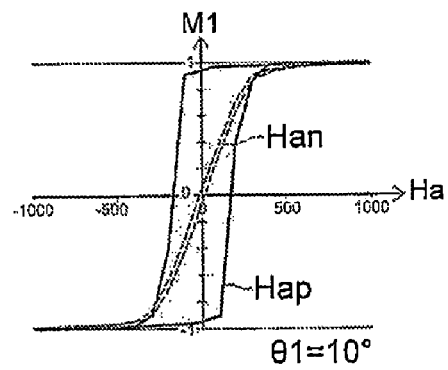
Figure 6D:
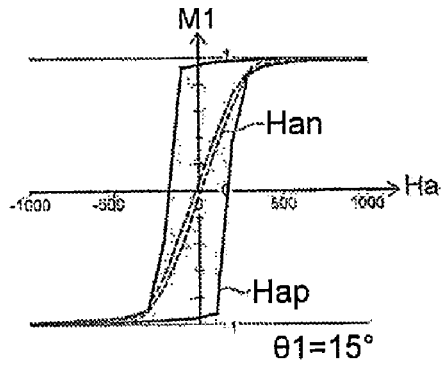
Figure 6E:
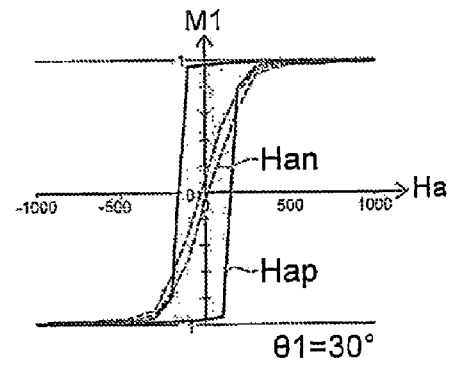
Figure 6F:
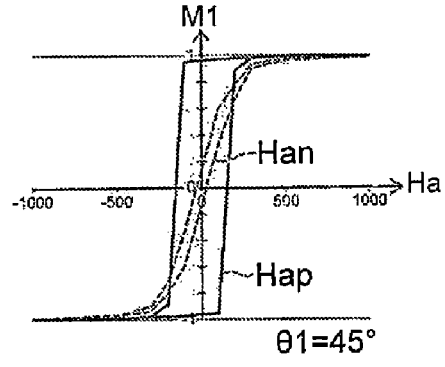

FIG. SA to FIG. 5D are schematic views illustrating magnetic characteristics of the semiconductor devices.

FIG. 5A and FIG. 5C correspond to the configuration of the semiconductor device 110. FIG. 58 and FIG. SD correspond to the configuration of the semiconductor device 119a. FIG. 5A and FIG. 5B are schematic views of the direction of magnetization. The orientation of the magnetization of the first magnetic planar region 11p is expressed by shading. In FIG. 5C and FIG. 5D, the orientation of the magnetization of the first magnetic planar region 11p is shown by arrows.

For the configuration of the semiconductor device 119a as shown in FIG. 5B, large magnetization direction change is observed in the entire region of the image. Conversely, for the configuration of the semiconductor device 110 as shown in FIG. 5A, the magnetization direction is substantially uniform.

As shown in FIG. 5D, for the configuration of the semiconductor device 119a, the directions of the arrows (the magnetizations) are disturbed at the end portion (the outer edge) of the first magnetic planar region 11p. The disturbance is called the magnetic domain. Even when the external magnetic field Ha is reduced to zero, the magnetic domain remains (being pinned) at the nonuniform portion such as the end portion. Conversely, for the configuration of the semiconductor device 110, the disturbance of the directions of the arrows (the magnetizations) is suppressed as shown in FIG. 5C.

Such a difference in the magnetic state affects the attenuation performance of the shield layer using the first magnetic planar region 11p. According to the configuration of the semiconductor device 110 according to the embodiment, the attenuation characteristics of the electromagnetic waves can be improved compared to the configuration of the semiconductor device 119a of the reference example.

FIG. 6A to FIG. 6F are graphs illustrating magnetic characteristics of the semiconductor devices. FIG. 6A to FIG. 6F show the magnetization curves when the first angle θ1 (the angle between the first magnetization direction 11pm and the second direction D2) is 0 degrees, 5 degrees, 10 degrees, 15 degrees, 30 degrees, and 45 degrees. In these figures, the horizontal axis is the applied magnetic field Ha. The vertical axis is the magnetization M1. The curve Hap corresponds to the case when the external magnetic field Ha is parallel to the first magnetization direction 11pm and the curve Han corresponds to the case when the external magnetic field Ha is perpendicular to the first magnetization direction 11pm.

The characteristic Hap will now be focused upon. As described above, the magnetization M1 becomes unstable when the first angle θ1 is 0 degrees. Such an unstable magnetic state is not observed when the first angle θ1 is 5 degrees or more. Accordingly, it is favorable for the first angle θ1 to be 5 degrees or more. Considering the nonuniformity in the manufacturing processes of the semiconductor device, it is more favorable for the first angle θ1 to be 10 degrees or more.

In the embodiment, the first magnetic planar region 11p is substantially a quadrilateral. The angle between the direction in which the first end portion 11pa extends (the second direction, e.g., the Y-axis direction) and the direction in which the end portion 11pb extends (the third direction, e.g., the X-axis direction) is substantially 90 degrees. Accordingly, in the embodiment, it is favorable for the first angle θ1 between the first magnetization direction 11pm and the second direction D2 (in the example, the Y-axis direction) to be greater than 5 degrees but less than 85 degrees. It is more favorable for the first angle θ1 to be greater than 10 degrees but less than 80 degrees.

The first magnetization direction 11pm is substantially aligned inside the X-Y plane. For example, it is favorable for the absolute value of the angle between the first magnetization direction 11pm and the first direction D1 (the Z-axis direction) to be not less than 80 degrees and not more than 100 degrees.

The electromagnetic waves that have a magnetic field component perpendicular to the first magnetization direction 11pm are reflected at the interfaces between the first magnetic planar region 11p and the nonmagnetic layer. By using multiple magnetic planar regions having magnetization directions that cross each other, electromagnetic waves that have magnetic field components in arbitrary direction can be reflected efficiently.

By providing the second magnetic planar region 12p in addition to the first magnetic planar region 11p in the embodiment, the attenuation characteristics of the electromagnetic waves can be further improved.

A configuration similar to that of the first magnetic planar region 11p is applicable to the second magnetic planar region 12p. It is favorable for the absolute value of the second angle θ2 between the second direction D2 and the second magnetization direction 12pm of the second magnetic planar region 12p to be greater than 5 degrees but less than 85 degrees. It is more favorable for the second angle θ2 to be greater than 10 degrees but less than 80 degrees. It is favorable for the absolute value of the angle between the first magnetization direction 11pm and the second magnetization direction 12pm to be not less than 45 degrees and not more than 135 degrees. It is more favorable for the absolute value of the angle between the first magnetization direction 11pm and the second magnetization direction 12pm to be not less than 80 degrees and not more than 100 degrees. It is favorable for the absolute value of the angle between the second magnetization direction 12pm and the first direction Di (the Z-axis direction) to be not less than 80 degrees and not more than 100 degrees.

In the embodiment, the second magnetic planar region 12p may include a material different from the material of the first magnetic planar region 11p. By using a different material, electromagnetic waves with different frequency bands can be reflected at different interfaces. Then, wider frequency band with high attenuation can be achieved.

In the embodiment as described above, a reflection of the electromagnetic wave occurs at the interface between the nonmagnetic layer and the magnetic layer. This is based on the difference in the impedances of these layers. The impedance for the electromagnetic wave of a conductive film (a metal film) is represented by $(j\omega\mu/\sigma)^{1/2}$. "j" is the imaginary unit. "ω" is the angular frequency of the electromagnetic wave. "μ" is the permeability of the metal film. "σ" is the conductivity of the metal film. For the nonmagnetic film, the permeability μ is 1. For the magnetic film, the permeability μ is greater than 1. The permeability μ corresponds to the slope of the magnetization curves shown in FIG. 3A, FIG. 3B, and FIG. 6A to FIG. 6F. When the magnetic field component of the electromagnetic wave is in the hard-axis direction of the magnetic layer (orthogonal to the easy magnetization-axis direction), the permeability μ exceeds 1. At this time, the difference in the impedances between the nonmagnetic layer and the magnetic layer becomes large. Thereby, the reflectance of the electromagnetic wave at the interface between the nonmagnetic layer and the magnetic layer becomes high. Multiple reflections also occur at the interface between the nonmagnetic layer and the magnetic layer. Thereby, the transmittance of the electromagnetic wave becomes low. In other words, the electromagnetic wave is attenuated. When the frequency of the electromagnetic wave is close to the FMR resonance frequency of the magnetic layer, the permeability μ increases drastically. At this time, the attenuation performance also increases drastically.

An example of the attenuation characteristics for the electromagnetic waves of a multi-layer system including a magnetic layer and nonmagnetic layer will now be described.

Figure 7:
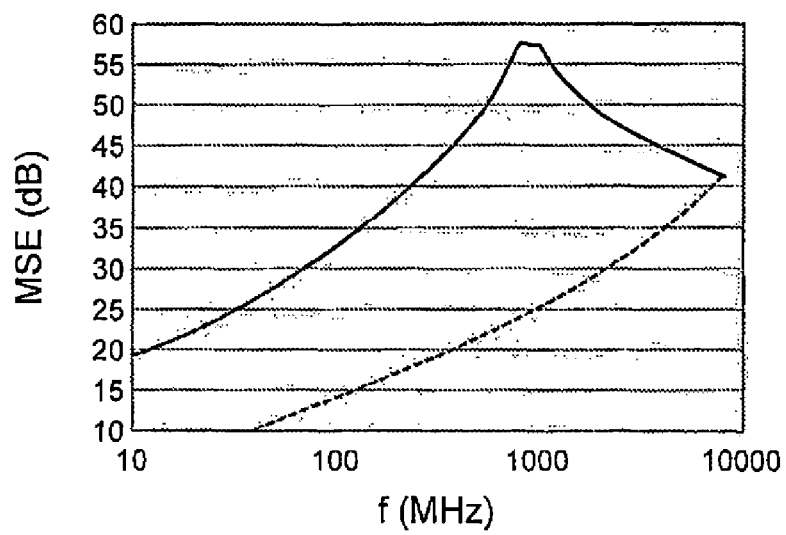
FIG. 7 is a graph illustrating a characteristic of the semiconductor devices.

FIG. 7 is a graph illustrating a shielding characteristic of the semiconductor devices.

FIG. 7 shows simulation results of the shielding characteristics of a first configuration (the solid line) and a second configuration (the broken line). The magnetic layer and the nonmagnetic layer are stacked in the first configuration. In the second configuration, only one nonmagnetic layer (a Cu layer) is provided (magnetic layer is not provided). In the first configuration, a CoZrNb layer is provided between two Cu layers. The thicknesses of the two Cu layer each are 400 nm. For the Cu layers, the conductivity σ is $5.8 \times 10^7$ S/m and the permeability μ is 1. The thickness of the CoZrNb layer is 200 nm. The following values are used for the CoZrNb layer. The conductivity σ is $8.3 \times 10^5$ S/m; the saturation magnetization Ms: 1 T; the anisotropic magnetic field Hk: 800 A/m; and the damping constant α: 0.01. On the other hand, for the second configuration, the thickness of the Cu layer is 1 μm. The total thickness of the first configuration is 1 μm and is the same as the thickness of the second configuration.

The horizontal axis of FIG. 7 is a frequency f (MHz). The vertical axis is an attenuation performance MSE (Magnetic Shield Effect) (dB). The MSE is defined as 20 times the logarithm of the ratio of the amplitude of the magnetic field of the transmitted electromagnetic wave to the amplitude of the magnetic field of the incident electromagnetic wave.

As seen in FIG. 7, a higher attenuation performance MSE is obtained for the first configuration (the solid line) than for the second configuration (the broken line). As in the embodiment, a high attenuation performance MSE is obtained by the stacked layer including the magnetic layer and the nonmagnetic layer.

Figure 8:
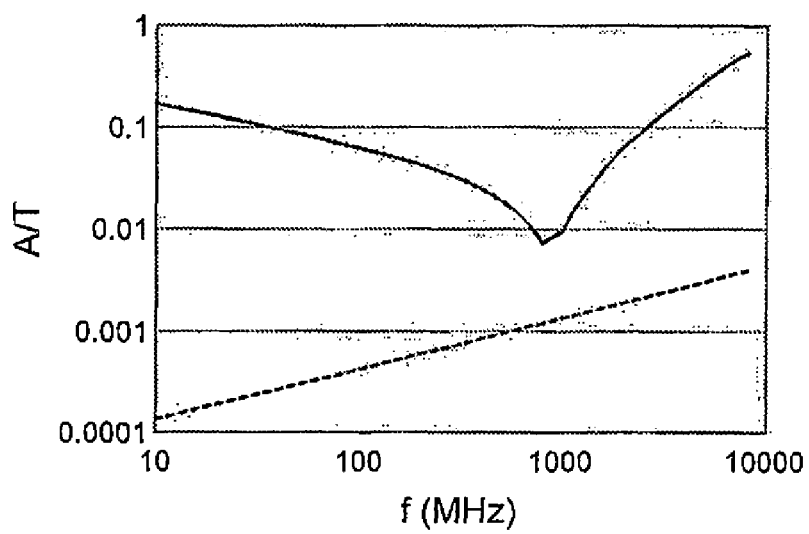
FIG. 8 is a graph illustrating a characteristic of the semiconductor devices.

FIG. 8 is a graph illustrating a shielding characteristic of the semiconductor devices.

FIG. 8 shows simulation results of the absorption (the broken line) of the CoZrNb layer and the transmittance (the solid line) at the interface between the Cu layer and the CoZrNb layer. In FIG. 8, the horizontal axis is the frequency f (MHz). The vertical axis is the absorption A or the transmittance T.

As shown in FIG. 8, the absorption A of the CoZrNb film changes monotonically as the frequency f changes. Conversely, the transmittance T at the interface between the Cu layer and the CoZrNb layer shows peculiar change with a minimum. The minimum value corresponds to the peak of the attenuation performance MSE illustrated by the solid line in FIG. 7. Therefore, the attenuation performance MSE illustrated by the solid line in FIG. 7 is based on the decrease in the transmittance at the interface between the Cu layer and the CoZrNb layer. As recited above, the decrease in the transmittance comes from the reflection at the interface between the nonmagnetic layer and the magnetic layer. Increase in the permeability μ of the magnetic layer brings the increase in the reflectance at the interface between the nonmagnetic layer and the magnetic layer. The increase in the reflectance brings the increase in the attenuation performance MSE.

In the embodiment, the magnetic layers (regions) and the nonmagnetic layers (regions) are provided in the first to fourth side surface portions 10a to 10d as well. Examples of the first to fourth side surface portions 10a to 10d will now be described.

FIG. 9A to FIG. 9D are schematic cross-sectional views illustrating portions of the semiconductor device.

Figure 9A:
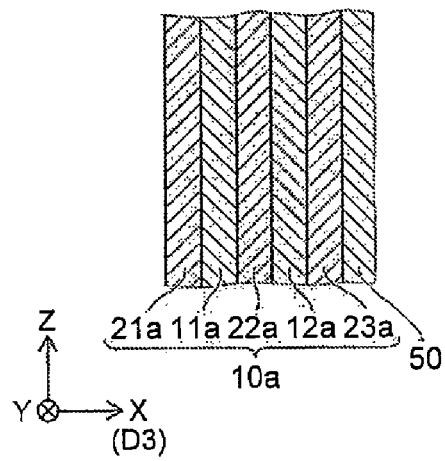
FIG. 9A to FIG. 9D are schematic cross-sectional views illustrating portions of the semiconductor device.

As shown in FIG. 9A, the first member 10 (the first side surface portion 10a) includes a first nonmagnetic side surface region 21a, a first magnetic side surface region 11a, and a second nonmagnetic side surface region 22a. The first nonmagnetic side surface region 21a is apart from the semiconductor element 50 in the third direction D3 (in the example, the X-axis direction). For example, the first nonmagnetic side surface region 21a is continuous with the first nonmagnetic planar region 21p. The first magnetic side surface region 11a is provided between the first nonmagnetic side surface region 21a and the semiconductor element 50 in the third direction D3. For example, the first magnetic side surface region 11a is continuous with the first magnetic planar region 11p. The second nonmagnetic side surface region 22a is provided between the first magnetic side surface region 11a and the semiconductor element 50 in the third direction D3. The second nonmagnetic side surface region 22a is continuous with the second nonmagnetic planar region 22p.

In the example, the first member 10 (the first side surface portion 10a) further includes a first other magnetic side surface region 12a and a first other nonmagnetic side surface region 23a. The first other magnetic side surface region 12a is provided between the second nonmagnetic side surface region 22a and the semiconductor element 50 in the third direction D3. For example, the first other magnetic side surface region 12a is continuous with the second magnetic planar region 12p. The first other nonmagnetic side surface region 23a is provided between the first other magnetic side surface region 12a and the semiconductor element 50 in the third direction D3. For example, the first other nonmagnetic side surface region 23a is continuous with the third nonmagnetic planar region 23p.

Figure 9B:
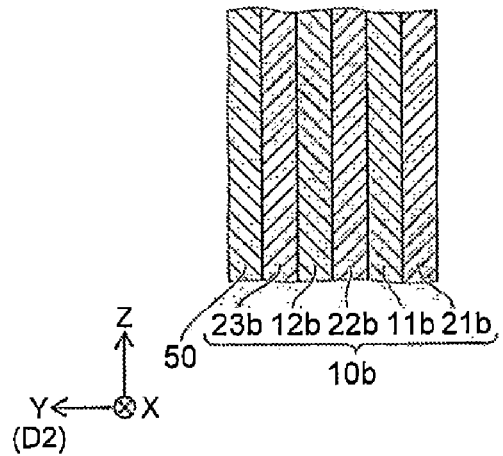

As shown in FIG. 9B, the first member 10 (the second side surface portion 10b) includes a third nonmagnetic side surface region 21b, a second magnetic side surface region 11b, and a fourth nonmagnetic side surface region 22b. The third nonmagnetic side surface region 21b is apart from the semiconductor element 50 in the second direction D2. For example, the third nonmagnetic side surface region 21b is continuous with the first nonmagnetic planar region 21p. The second magnetic side surface region 11b is provided between the third nonmagnetic side surface region 21b and the semiconductor element 50 in the second direction D2. For example, the second magnetic side surface region 11b is continuous with the first magnetic planar region 11p. The fourth nonmagnetic side surface region 22b is provided between the second magnetic side surface region 11b and the semiconductor element 50 in the second direction D2. For example, the fourth nonmagnetic side surface region 22b is continuous with the second nonmagnetic planar region 22p.

In the example, the first member 10 (the second side surface portion 10b) further includes a second other magnetic side surface region 12b and a second other nonmagnetic side surface region 23b. The second other magnetic side surface region 12b is provided between the fourth nonmagnetic side surface region 22b and the semiconductor element 50 in the second direction D2. For example, the second other magnetic side surface region 12b is continuous with the second magnetic planar region 12p. The second other nonmagnetic side surface region 23b is provided between the second other magnetic side surface region 12b and the semiconductor element 50 in the second direction D2. For example, the second other nonmagnetic side surface region 23b is continuous with the third nonmagnetic planar region 23p.

Figure 9C:
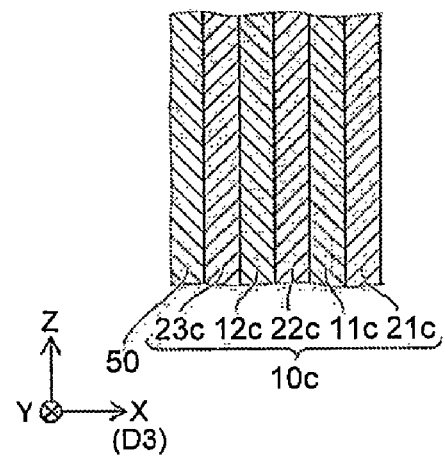

As shown in FIG. 9C, the first member 10 (the third side surface portion 10c) includes a fifth nonmagnetic side surface region 21c, a third magnetic side surface region 11c, and a sixth nonmagnetic side surface region 22c. The semiconductor element 50 is positioned between the second nonmagnetic side surface region 22a and the fifth nonmagnetic side surface region 21c in the third direction D3. The third magnetic side surface region 11c is positioned between the fifth nonmagnetic side surface region 21c and the semiconductor element 50 in the third direction D3. The sixth nonmagnetic side surface region 22c is positioned between the third magnetic side surface region 11c and the semiconductor element 50 in the third direction D3. For example, the fifth nonmagnetic side surface region 21c is continuous with the first nonmagnetic planar region 21p. For example, the third magnetic side surface region 11c is continuous with the first magnetic planar region 11p. For example, the sixth nonmagnetic side surface region 22c is continuous with the second nonmagnetic planar region 22p.

In the example, the first member 10 (the third side surface portion 10c) further includes a third other magnetic side surface region 12c and a third other nonmagnetic side surface region 23c. The third other magnetic side surface region 12c is positioned between the sixth nonmagnetic side surface region 22c and the semiconductor element 50 in the third direction D3. The third other nonmagnetic side surface region 23c is positioned between the third other magnetic side surface region 12c and the semiconductor element 50 in the third direction D3. For example, the third other magnetic side surface region 12c is continuous with the second magnetic planar region 12p. For example, the third other nonmagnetic side surface region 23c is continuous with the third nonmagnetic planar region 23p.

Figure 9D:
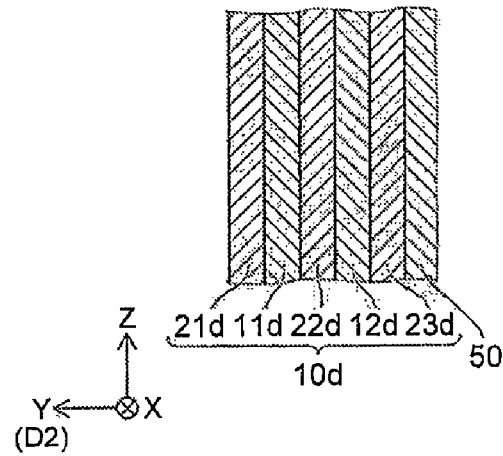

As shown in FIG. 9D, the first member 10 (the fourth side surface portion 10d) includes a seventh nonmagnetic side surface region 21d, a fourth magnetic side surface region 11d, and an eighth nonmagnetic side surface region 22d. The semiconductor element 50 is positioned between the third nonmagnetic side surface region 21b and the seventh nonmagnetic side surface region 21d in the second direction D2. The fourth magnetic side surface region lid is positioned between the seventh nonmagnetic side surface region 21d and the semiconductor element 50 in the second direction D2. The eighth nonmagnetic side surface region 22d is positioned between the fourth magnetic side surface region lid and the semiconductor element 50 in the second direction D2. For example, the seventh nonmagnetic side surface region 21d is continuous with the first nonmagnetic planar region 21p. For example, the fourth magnetic side surface region lid is continuous with the first magnetic planar region 11p. For example, the eighth nonmagnetic side surface region 22d is continuous with the second nonmagnetic planar region 22p.

In the example, the first member 10 (the fourth side surface portion 10d) further includes a fourth other magnetic side surface region 12d and a fourth other nonmagnetic side surface region 23d. The fourth other magnetic side surface region 12d is positioned between the eighth nonmagnetic side surface region 22d and the semiconductor element 50 in the second direction D2. The fourth other nonmagnetic side surface region 23d is positioned between the fourth other magnetic side surface region 12d and the semiconductor element 50 in the second direction D2. For example, the fourth other magnetic side surface region 12d is continuous with the second magnetic planar region 12p. For example, the fourth other nonmagnetic side surface region 23d is continuous with the third nonmagnetic planar region 23p.

Thus, by providing the magnetic layers (regions) and the nonmagnetic layers (regions) in each of the first to fourth side surface portions 10a to 10d, the transmittance of the electromagnetic wave traveling in the X-Y plane can be reduced. The attenuation characteristics of the electromagnetic waves can be improved further.

At the side surface portions, the directions of the magnetizations of two (multiple) magnetic layers (regions) may cross each other. Thereby, the transmittance of the electromagnetic wave with magnetic component with arbitrary direction can be reduced.

In the embodiment, the first member 10 may include one magnetic layer and one nonmagnetic layer. For example, the first member 10 includes a nonmagnetic planar region and the first magnetic planar region 11p. The nonmagnetic planar region is, for example, one of the first nonmagnetic planar region 21p or the second nonmagnetic planar region 22p. The direction from the first magnetic planar region 11p toward the nonmagnetic planar region is in the first direction D1 from the semiconductor element 50 toward the nonmagnetic planar region. The first magnetic planar region 11p also includes the first end portion 11pa extending along the second direction D2 crossing the first direction D1. The first magnetization direction 11pm of the first magnetic planar region 11p is tilted with respect to the second direction D2.

A wire inside the semiconductor chip 53 is a noise source of the electromagnetic wave. For example, when the wire is substantially aligned with the first direction D1 or the second direction D2, the direction of the magnetic field component of the electromagnetic wave noise is substantially in the first direction D1 or second direction D2. In such a case, since there is substantially no electromagnetic wave having a magnetic field component parallel to the first magnetization direction 11pm, a high attenuation performance is expected.

The first member 10 may further include the second magnetic planar region 12p. The nonmagnetic planar region (in this case, the second nonmagnetic planar region 22p) is positioned between the first magnetic planar region 11p and the second magnetic planar region 12p in the first direction D1. The second magnetic planar region 12p includes the second end portion 12pa extending along the second direction D2. The second magnetization direction 12pm of the second magnetic planar region 12p is tilted with respect to the second direction D2. The second magnetization direction 12pm crosses the first magnetization direction 11pm.

When the number of magnetic layers or nonmagnetic layers provided in the first member 10 is small, the thickness of the first member 10 is thin. Thereby, the thickness of the semiconductor device can be thin.

In the embodiment, at least one of the first magnetic planar region 11p or the second magnetic planar region 12p includes at least one selected from the group consisting of Fe, Co, and Ni. At least one of the first magnetic planar region 11p or the second magnetic planar region 12p includes, for example, at least one selected from the group consisting of NiFe, CoZrNb, FeSi, and FeCo.

At least one of the first nonmagnetic planar region 21p, the second nonmagnetic planar region 22p, or the second nonmagnetic planar region 22p includes, for example, at least one selected from the group consisting of Cu, Al, Ni, Cr, Mn, Mo, Zr, and Si.

The thickness (the length along the Z-axis direction) of one of the magnetic planar regions recited above is, for example, not less than 10 nm and not more than 10 µm. The thickness (the length along the Z-axis direction) of one of the nonmagnetic planar regions recited above is, for example, not less than 10 nm and not more than 10 µm.

In the embodiment, the thickness (the length along the Z-axis direction) of the planar portion 10p of the first member 10 is, for example, not less than 20 nm and not more than 20 µm. Because the magnetic layers (regions) and the nonmagnetic layers (regions) are provided in the embodiment, a high attenuation effect is achieved even in the case where the thickness of the planar portion 10p is thin. The thickness of the semiconductor device according to the embodiment can be reduced.

In the embodiment, the information on the magnetization direction in the magnetic planar region is obtained by, for example, such as magnetic Kerr microscopy. The information on the magnetization direction in the magnetic planar region may be obtained by a magnetization measurement. For example, the magnetic hysteresis curve can be obtained by using a vibrating sample magnetometer (VSM). This curve provides the information on the magnetization direction.

An example of a method for manufacturing the semiconductor device according to the embodiment will now be described.

The manufacturing method includes a process of preparing the semiconductor element 50, and a process of forming the first member 10 on the semiconductor element 50 (referring to FIG. 2A). The first member 10 includes a nonmagnetic planar region (e.g., at least one of the first nonmagnetic planar region 21p or the second nonmagnetic planar region 22p) and the first magnetic planar region 11p. The direction from the first magnetic planar region 11p toward the nonmagnetic planar region is in the first direction D1 from the semiconductor element 50 toward the nonmagnetic planar region. The first magnetic planar region 11p includes the first end portion 11pa extending along the second direction D2 crossing the first direction Di. The first magnetization direction 11pm of the first magnetic planar region 11p is tilted with respect to the second direction D2 (referring to FIG. 2C).

The first member 10 may further include the second magnetic planar region 12p. The magnetic planar region is positioned between the first magnetic planar region 11p and the second magnetic planar region 12p in the first direction D1. The second magnetic planar region 12p includes the second end portion 12pa extending along the second direction D2. The second magnetization direction 12pm of the second magnetic planar region 12p is tilted with respect to the second direction D2 and crosses the first magnetization direction 11pm.

In the manufacturing method recited above, the formation of the first magnetic planar region 11p includes depositing a magnetic film while applying a first magnetic field. For example, the direction of the first magnetic field is tilted with respect to the second direction D2. For example, the direction of the first magnetic field corresponds to the first magnetization direction 11pm.

In the manufacturing method recited above, the formation of the second magnetic planar region 12p includes depositing a magnetic film while applying a second magnetic field. The direction of the second magnetic field is, for example, tilted with respect to the second direction D2 and crosses the direction of the first magnetic field. For example, the direction of the second magnetic field corresponds to the second magnetization direction 12pm.

The embodiments may include the following configurations (e.g., technological proposals).

Configuration 1

A semiconductor device, comprising:
a semiconductor element; and
a first member,
the first member including
a first nonmagnetic planar region separated from the semiconductor element in a first direction,
a first magnetic planar region provided between the first nonmagnetic planar region and the semiconductor element in the first direction, and
a second nonmagnetic planar region provided between the first magnetic planar region and the semiconductor element in the first direction,
the first magnetic planar region including a first end portion extending along a second direction crossing the first direction,
a first magnetization direction of the first magnetic planar region being tilted with respect to the second direction.

Configuration 2

The semiconductor device according to Configuration 1, wherein an angle between the first magnetization direction and the second direction is greater than 5 degrees but less than 85 degrees.

Configuration 3

The semiconductor device according to Configuration 1 or 2, wherein the absolute value of an angle between the first magnetization direction and the first direction is not less than 80 degrees and not more than 100 degrees.

Configuration 4

The semiconductor device according to any one of Configurations 1 to 3, wherein
the first member further includes:
a first nonmagnetic side surface region separated from the semiconductor element in a third direction, the third direction crossing a plane including the first direction and the second direction;
a first magnetic side surface region provided between the first nonmagnetic side surface region and the semiconductor element in the third direction; and
a second nonmagnetic side surface region provided between the first magnetic side surface region and the semiconductor element in the third direction.

Configuration 5

The semiconductor device according to Configuration 4, wherein
the first member further includes:
a third nonmagnetic side surface region separated from the semiconductor element in the second direction;
a second magnetic side surface region provided between the first nonmagnetic side surface region and the semiconductor element in the second direction; and
a fourth nonmagnetic side surface region provided between the first magnetic side surface region and the semiconductor element in the second direction.

Configuration 6

The semiconductor device according to Configuration 5, wherein
the first member further includes:
a fifth nonmagnetic side surface region;
a third magnetic side surface region; and
a sixth nonmagnetic side surface region,
the semiconductor element is positioned between the second nonmagnetic side surface region and the fifth nonmagnetic side surface region in the third direction,
the third magnetic side surface region is positioned between the fifth nonmagnetic side surface region and the semiconductor element in the third direction, and
the sixth nonmagnetic side surface region is positioned between the third magnetic side surface region and the semiconductor element in the third direction.

Configuration 7

The semiconductor device according to Configuration 6, wherein the first member further includes:

a seventh nonmagnetic side surface region;

a fourth magnetic side surface region; and an eighth nonmagnetic side surface region, the semiconductor element is positioned between the third nonmagnetic side surface region and the seventh nonmagnetic side surface region in the second direction, the fourth magnetic side surface region is positioned between the seventh nonmagnetic side surface region and the semiconductor element in the second direction, and the eighth nonmagnetic side surface region is positioned between the fourth magnetic side surface region and the semiconductor element in the second direction.

Configuration 8

The semiconductor device according to any one of Configurations 1 to 3, wherein the first member further includes:

a second magnetic planar region provided between the second nonmagnetic planar region and the semiconductor element in the first direction; and a third nonmagnetic planar region provided between the second magnetic planar region and the semiconductor element in the first direction, the second magnetic planar region includes a second end portion extending along the second direction, and a second magnetization direction of the second magnetic planar region is tilted with respect to the second direction and crosses the first magnetization direction.

Configuration 9

The semiconductor device according to Configuration 8, wherein the absolute value of an angle between the second magnetization direction and the second direction is greater than 5 degrees but less than 85 degrees.

Configuration 10

The semiconductor device according to Configuration 8 or 9, wherein the absolute value of an angle between the first magnetization direction and the second magnetization direction is not less than 45 degrees and not more than 135 degrees.

Configuration 11

The semiconductor device according to any one of Configurations 8 to 10, wherein the second magnetic planar region includes a material different from a material of the first magnetic planar region.

Configuration 12

The semiconductor device according to any one of Configurations 8 to 11, wherein the first member further includes:

a first nonmagnetic side surface region separated from the semiconductor element in a third direction, the third direction crossing a plane including the first direction and the second direction;

a first magnetic side surface region provided between the first nonmagnetic side surface region and the semiconductor element in the third direction;

a second nonmagnetic side surface region provided between the first magnetic side surface region and the semiconductor element in the third direction;

a first other magnetic side surface region provided between the second nonmagnetic side surface region and the semiconductor element in the third direction; and a first other nonmagnetic side surface region provided between the first other magnetic side surface region and the semiconductor element in the third direction.

Configuration 13

The semiconductor device according to Configuration 12, wherein the first member further includes:

a third nonmagnetic side surface region separated from the semiconductor element in the second direction;

a second magnetic side surface region provided between the first nonmagnetic side surface region and the semiconductor element in the second direction;

a fourth nonmagnetic side surface region provided between the first magnetic side surface region and the semiconductor element in the second direction;

a second other magnetic side surface region provided between the fourth nonmagnetic side surface region and the semiconductor element in the second direction; and a second other nonmagnetic side surface region provided between the second other magnetic side surface region and the semiconductor element in the second direction.

Configuration 14

The semiconductor device according to Configuration 13, wherein the first member further includes:

a fifth nonmagnetic side surface region;

a third magnetic side surface region;

a sixth nonmagnetic side surface region;

a third other magnetic side surface region; and a third other nonmagnetic side surface region, the semiconductor element is positioned between the second nonmagnetic side surface region and the fifth nonmagnetic side surface region in the third direction, the third magnetic side surface region is positioned between the fifth nonmagnetic side surface region and the semiconductor element in the third direction, the sixth nonmagnetic side surface region is positioned between the third magnetic side surface region and the semiconductor element in the third direction, the third other magnetic side surface region is positioned between the sixth nonmagnetic side surface region and the semiconductor element in the third direction, and the third other nonmagnetic side surface region is positioned between the third other magnetic side surface region and the semiconductor element in the third direction.

Configuration 15

The semiconductor device according to Configuration 14, wherein the first member further includes:

a seventh nonmagnetic side surface region;

a fourth magnetic side surface region;

an eighth nonmagnetic side surface region;

a fourth other magnetic side surface region; and a fourth other nonmagnetic side surface region, the semiconductor element is positioned between the third nonmagnetic side surface region and the seventh nonmagnetic side surface region in the second direction, the fourth magnetic side surface region is positioned between the seventh nonmagnetic side surface region and the semiconductor element in the second direction, the eighth nonmagnetic side surface region is positioned between the fourth magnetic side surface region and the semiconductor element in the second direction, the fourth other magnetic side surface region is positioned between the eighth nonmagnetic side surface region and the semiconductor element in the second direction, and the fourth other nonmagnetic side surface region is positioned between the fourth other magnetic side surface region and the semiconductor element in the second direction.

Configuration 16

The semiconductor device according to any one of Configurations 12 to 15, wherein the second magnetic planar region contacts the second nonmagnetic planar region and the third nonmagnetic planar region.

Configuration 17

The semiconductor device according to any one of Configurations 1 to 16, wherein the first magnetic planar region contacts the first nonmagnetic planar region and the second nonmagnetic planar region.

Configuration 18

The semiconductor device according to any one of Configurations 1 to 17, wherein the first magnetic planar region includes at least one selected from the group consisting of Fe, Co, and Ni.

Configuration 19

The semiconductor device according to any one of Configurations 1 to 9, wherein the first magnetic planar region includes at least one selected from the group consisting of NiFe, CoZrNb, FeSi, and FeCo.

Configuration 20

The semiconductor device according to any one of Configurations 1 to 19, wherein at least one of the first nonmagnetic planar region or the second nonmagnetic planar region includes at least one selected from the group consisting of Cu, Al, Ni, Cr, Mn, Mo, Zr, and Si.

According to the embodiments, a semiconductor device can be provided in which the attenuation characteristics of electromagnetic waves can be improved.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor elements, semiconductor chips, first members, magnetic regions, nonmagnetic regions, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a semiconductor element; and
a first member,
the first member including
a first nonmagnetic planar region separated from the semiconductor element in a first direction,
a first magnetic planar region provided between the first nonmagnetic planar region and the semiconductor element in the first direction, and
a second nonmagnetic planar region provided between the first magnetic planar region and the semiconductor element in the first direction,
a second magnetic planar region provided between the second nonmagnetic planar region and the semiconductor element in the first direction; and
a third nonmagnetic planar region provided between the second magnetic planar region and the semiconductor element in the first direction,
the first magnetic planar region including a first end portion extending along a second direction crossing the first direction,
a first magnetization direction of the first magnetic planar region being tilted with respect to the second direction in a plane perpendicular to the first direction,
wherein
the second magnetic, planar region includes a second end portion extending along the second direction, and
a second magnetization direction of the second magnetic planar region is tilted with respect to the second direction and crosses the first magnetization direction.

2. The device according to claim 1, wherein an angle between the first magnetization direction and the second direction is greater than 5 degrees but less than 85 degrees.

3. The device according to claim 1, wherein the absolute value of an angle between the first magnetization direction and the first direction is not less than 80 degrees and not more than 100 degrees.

4. The device according to claim 1, wherein
the first member further includes:
a first nonmagnetic side surface region separated from the semiconductor element in a third direction, the third direction crossing a plane including the first direction and the second direction;
a first magnetic side surface region provided between the first nonmagnetic side surface region and the semiconductor element in the third direction; and
a second nonmagnetic side surface region provided between the first magnetic side surface region and the semiconductor element in the third direction.

5. The device according to claim 4, wherein
the first member further includes:
a third nonmagnetic side surface region separated from the semiconductor element in the second direction;
a second magnetic side surface region provided between the third nonmagnetic side surface region and the semiconductor element in the second direction; and
a fourth nonmagnetic side surface region provided between the second magnetic side surface region and the semiconductor element in the second direction.

6. The device according to claim 5, wherein
the first member further includes:
a fifth nonmagnetic side surface region;
a third magnetic side surface region; and
a sixth nonmagnetic side surface region,
the semiconductor element is provided between the second nonmagnetic side surface region and the fifth nonmagnetic side surface region in the third direction,
the third magnetic side surface region is provided between the fifth nonmagnetic side surface region and the semiconductor element in the third direction, and
the sixth nonmagnetic side surface region is provided between the third magnetic side surface region and the semiconductor element in the third direction.

7. The device according to claim 6, wherein
the first member further includes:
a seventh nonmagnetic side surface region;
a fourth magnetic side surface region; and
an eighth nonmagnetic side surface region,
the semiconductor element is provided between the third nonmagnetic side surface region and the seventh nonmagnetic side surface region in the second direction,
the fourth magnetic side surface region is provided between the seventh nonmagnetic side surface region and the semiconductor element in the second direction, and
the eighth nonmagnetic side surface region is provided between the fourth magnetic side surface region and the semiconductor element in the second direction.

8. The device according to claim 1, wherein the absolute value of an angle between the second magnetization direction and the second direction is greater than 5 degrees but less than 85 degrees.

9. The device according to claim 1, wherein the absolute value of an angle between the first magnetization direction and the second magnetization direction is not less than 45 degrees and not more than 135 degrees.

10. The device according to claim 1, wherein the second magnetic planar region includes a material different from a material of the first magnetic planar region.

11. The device according to claim 1, wherein
the first member further includes:
a first nonmagnetic side surface region separated from the semiconductor element in a third direction, the third direction crossing a plane including the first direction and the second direction;
a first magnetic side surface region provided between the first nonmagnetic side surface region and the semiconductor element in the third direction;
a second nonmagnetic side surface region provided between the first magnetic side surface region and the semiconductor element in the third direction;
a first other magnetic side surface region provided between the second nonmagnetic side surface region and the semiconductor element in the third direction; and
a first other nonmagnetic side surface region provided between the first other magnetic side surface region and the semiconductor element in the third direction.

12. The device according to claim 11, wherein
the first member further includes:
a third nonmagnetic side surface region separated from the semiconductor element in the second direction;
a second magnetic side surface region provided between the third nonmagnetic side surface region and the semiconductor element in the second direction;
a fourth nonmagnetic side surface region provided between the second magnetic side surface region and the semiconductor element in the second direction;
a second other magnetic side surface region provided between the fourth nonmagnetic side surface region and the semiconductor element in the second direction; and
a second other nonmagnetic side surface region provided between the second other magnetic side surface region and the semiconductor element in the second direction.

13. The device according to claim 12, wherein
the first member further includes:
a fifth nonmagnetic side surface region;
a third magnetic side surface region;
a sixth nonmagnetic side surface region;
a third other magnetic side surface region; and
a third other nonmagnetic side surface region,
the semiconductor element is provided between the second nonmagnetic side surface region and the fifth nonmagnetic side surface region in the third direction,
the third magnetic side surface region is provided between the fifth nonmagnetic side surface region and the semiconductor element in the third direction,
the sixth nonmagnetic side surface region is provided between the third magnetic side surface region and the semiconductor element in the third direction,
the third other magnetic side surface region is provided between the sixth nonmagnetic side surface region and the semiconductor element in the third direction, and
the third other nonmagnetic side surface region is provided between the third other magnetic side surface region and the semiconductor element in the third direction.

14. The device according to claim 13, wherein
the first member further includes:
a seventh nonmagnetic side surface region;
a fourth magnetic side surface region;
an eighth nonmagnetic side surface region;
a fourth other magnetic side surface region; and
a fourth other nonmagnetic side surface region,
the semiconductor element is provided between the third nonmagnetic side surface region and the seventh nonmagnetic side surface region in the second direction,
the fourth magnetic side surface region is provided between the seventh nonmagnetic side surface region and the semiconductor element in the second direction,
the eighth nonmagnetic side surface region is provided between the fourth magnetic side surface region and the semiconductor element in the second direction,
the fourth other magnetic side surface region is provided between the eighth nonmagnetic side surface region and the semiconductor element in the second direction, and
the fourth other nonmagnetic side surface region is provided between the fourth other magnetic side surface region and the semiconductor element in the second direction.

15. The device according to claim 11, wherein the second magnetic planar region contacts the second nonmagnetic planar region and the third nonmagnetic planar region.

16. The device according to claim 1, wherein the first magnetic planar region contacts the first nonmagnetic planar region and the second nonmagnetic planar region.

17. The device according to claim 1, wherein the first magnetic planar region includes at least one selected from the group consisting of Fe, Co, and Ni.

18. The device according to claim 1, wherein the first magnetic planar region includes at least one selected from the group consisting of NiFe, CoZrNb, FeSi, and FeCo.

19. The device according to claim 1, wherein at least one of the first nonmagnetic planar region or the second nonmagnetic planar region includes at least one selected from the group consisting of Cu, Al, Ni, Cr, Mn, Mo, Zr, and Si.

* * * * *